(12) United States Patent
Hsieh et al.

(10) Patent No.: US 9,978,736 B1
(45) Date of Patent: May 22, 2018

(54) METHOD FOR MANUFACTURING MEMORY HAVING STACKED INTEGRATED CIRCUIT CHIP

(71) Applicant: ATP ELECTRONICS TAIWAN INC., Taipei (TW)

(72) Inventors: Tieh-Chin Hsieh, Taipei (TW); Yu-Yin Kuo, Taipei (TW); Hsi-Yang Huang, Taipei (TW)

(73) Assignee: ATP ELECTRONICS TAIWAN INC., Taipei (TW)

( * ) Notice: Subject to any disclaimer, the term of this patent is extended or adjusted under 35 U.S.C. 154(b) by 0 days. days.

(21) Appl. No.: 15/703,144

(22) Filed: Sep. 13, 2017

(30) Foreign Application Priority Data

Jul. 20, 2017 (TW) .............................. 106124397 A

(51) Int. Cl.
*H01L 23/00* (2006.01)
*H01L 23/31* (2006.01)
(Continued)

(52) U.S. Cl.
CPC .............. *H01L 25/50* (2013.01); *H01L 21/56* (2013.01); *H01L 23/293* (2013.01); *H01L 23/3114* (2013.01); *H01L 23/50* (2013.01); *H01L 24/03* (2013.01); *H01L 24/05* (2013.01); *H01L 24/11* (2013.01); *H01L 24/13* (2013.01); *H01L 24/16* (2013.01); *H01L 24/81* (2013.01); *H01L 25/0657* (2013.01); *H01L 2224/0346* (2013.01); *H01L 2224/03552* (2013.01); *H01L 2224/0401* (2013.01); *H01L 2224/05016* (2013.01); *H01L 2224/05083* (2013.01); *H01L 2224/05144* (2013.01); *H01L 2224/05147* (2013.01); *H01L 2224/05155* (2013.01); *H01L 2224/14131* (2013.01); *H01L 2224/16145* (2013.01); *H01L 2224/16225* (2013.01);
(Continued)

(58) Field of Classification Search
CPC ......... H01L 24/03; H01L 24/05; H01L 24/11; H01L 24/13; H01L 24/16; H01L 24/81; H01L 25/50; H01L 25/0657; H01L 23/3114

See application file for complete search history.

(56) References Cited

U.S. PATENT DOCUMENTS

| 2011/0057327 | A1* | 3/2011 | Yoshida | H01L 21/6835 257/777 |
| 2013/0082399 | A1* | 4/2013 | Kim | H01L 24/19 257/774 |
| 2015/0333026 | A1* | 11/2015 | Gandhi | H01L 23/4012 257/737 |

* cited by examiner

*Primary Examiner* — Christine Enad
(74) *Attorney, Agent, or Firm* — Muncy, Geissler, Olds & Lowe, P.C.

(57) ABSTRACT

A method for manufacturing a memory having at least one stacked integrated circuit chip is firstly to remove a plurality of transitional weld structures from a first IC chip. A varied insulation layer is then formed on the first IC chip. The varied insulation layer is then processed by a laser beam to form a plurality of metal-disposed portions. A plurality of chip-conductive structures are then formed on the metal-disposed portions. A plurality of manufactured weld structures is formed on the chip conductive structures. A second IC chip having a plurality of original weld structures is then provided to the first IC chip. The original weld structures of the second IC chip are connected to the chip conductive structures of the first IC chip to form a stacked IC chip. The stacked IC chip is then mounted onto a memory substrate component to form a memory having the stacked IC chip.

14 Claims, 13 Drawing Sheets

(51) Int. Cl.
*H01L 25/00* (2006.01)
*H01L 25/065* (2006.01)
*H01L 23/50* (2006.01)
*H01L 21/56* (2006.01)
*H01L 23/29* (2006.01)

(52) U.S. Cl.
CPC ........... *H01L 2225/06513* (2013.01); *H01L 2225/06517* (2013.01); *H01L 2225/06551* (2013.01); *H01L 2924/1434* (2013.01); *H01L 2924/1436* (2013.01)

METHOD FOR MANUFACTURING MEMORY HAVING STACKED INTEGRATED CIRCUIT CHIP

BACKGROUND OF THE INVENTION

1. Field of the Invention

The invention relates to a manufacturing method of memories, and more particularly to a method for manufacturing a memory having a stacked integrated circuit chip that applies laser beams to form a metal-disposed portion of the memory.

2. Description of the Prior Art

After the information revolution since 1980s, the speed of data transmission has been significantly increased, while the cost thereof has been greatly reduced. Generally, a person needs only a personal computer to communicate any person in the world through simply an internet. Thus, people's daily life styles have been changed remarkably.

Particularly, except for transmitting the information through the internet, the personal computer can also be applied for documenting, word processing, entertainments, gaming and programming. However, to achieve any of aforesaid functions, a memory on a main board of the computer is necessary, in which the memory is to temporarily store data generated during the computer operations. Hence, the memory is one of indispensable components in the computer.

In manufacturing the memory, a plurality of memory chips would be disposed on a memory circuit board. Currently, in order to enlarge the capacity of the memory, a dual die package (DDP) is generally applied. For carrying out the dual die package, a re-distribution layer (RDL) and a flip-chip in a chip scale package (CSP) are implemented. However, in performing the re-distribution layer and the flip-chip, since the precision is high and the working processes are complicated, this additional expense on manufacturing is definitely inevitable.

SUMMARY OF THE INVENTION

In view of the prior art, if the dual die package is applied to produce the memory, then the re-distribution layer and the flip-chip are inevitable, thus manufacturing difficulty is increased, and definitely higher manufacturing cost can be expected.

Accordingly, it is an object of the present invention to provide a method for manufacturing a memory having a stacked integrated circuit chip. Firstly, a first IC chip is provided, in which the first IC chip includes a first disposition surface and a second disposition surface furnished with a plurality of first chip-welding pads. The second disposition surface further has a plurality of transitional weld structures electrically coupled with the plurality of first chip-welding pads. Then, the plurality of transitional weld structures of the second disposition surface are removed so as to form a first varied insulation layer and a second varied insulation layer on the first disposition surface and the second disposition surface, respectively. The plurality of first chip-welding pads are exposed out of the second varied insulation layer.

Then, a laser beam is individually projected onto the first varied insulation layer and the second varied insulation layer so as to form a plurality of first metal-disposed portions from the first varied insulation layer, and further to form a plurality of second metal-disposed portions from the second varied insulation layer by being close to the plurality of first chip-welding pads and electrically coupled with the plurality of first chip-welding pads. Both the first metal-disposed portions and the second metal-disposed portions are capable to be plated by metals. In addition, a plurality of connection portions are connected individually with the plurality of first metal-disposed portions and the plurality of second metal-disposed portions. Then, a plurality of chip-conducting structures are formed by a plurality of conductive materials to connectively cover onto the plurality of first chip-welding pads, the plurality of first metal-disposed portions, the plurality of second metal-disposed portions and the plurality of connection portions.

Then, a plurality of manufactured weld structures are both formed on the plurality of chip-conducting structures on the plurality of second metal-disposed portions and on the plurality of first chip-welding pads. Thereafter, a second IC chip electrically coupled with a plurality of original weld structures is provided. The plurality of original weld structures of the second IC chip are connected with the plurality of chip-conducting structures on the plurality of first metal-disposed portions of the first IC chip, so as to form a stacked IC chip. Finally, the plurality of manufactured weld structures are used to mount the stacked IC chip onto a memory substrate component, so as to form a memory having a stacked IC chip.

In one embodiment of the present invention, any one of transitional weld structures, the manufactured weld structures and the original weld structures is a BAG (ball grid array) ball.

In one embodiment of the present invention, each of the second metal-disposed portions includes an oblique disposition sidewall to connect the respective connection portion and the respective first chip-welding pad, and each of the chip-conducting structures includes a connection lead, an oblique contact plate and a welding pad.

The connection lead is disposed on the respective connection portion. The oblique contact plate connects the connection lead and is disposed on the oblique disposition sidewall so as to contact the corresponding manufactured weld structures on the corresponding chip-conducting structure of the respective second metal-disposed portion. The welding pad connects the oblique contact plate and is disposed on the respective first chip-welding pad, so as to connect the corresponding manufactured weld structures on the respective chip-conducting structure on the respective second metal-disposed portion and first chip-welding pad.

In one embodiment of the present invention, the chip-conducting structure is connectively plated onto the first metal-disposed portion, the second metal-disposed portion, the first chip-welding pad and the connection portion.

In one embodiment of the present invention, the conductive materials include a first conductive material, a second conductive material and a third conductive material. While in forming the chip-conducting structure, a first conductive layer is firstly formed by the first conductive material to connectively cover onto the plurality of first metal-disposed portions, the plurality of second metal-disposed portions, the plurality of first chip-welding pads and the plurality of connection portions.

Then, a second conductive layer is formed by the second conductive material on the first conductive layer, and a third conductive layer is formed by the third conductive material on the second conductive layer, so as to form the corresponding chip-conducting structure. The first conductive material is copper, the second conductive material is nickel, and the third conductive material is gold.

In one embodiment of the present invention, the first varied insulation layer and the second varied insulation layer are formed by a varied insulation material disable to be plated by metals, so that, after being projected by the laser beam, the first varied insulation layer and the second varied insulation layer form the plurality of first metal-disposed portions and the plurality of second metal-disposed portions capable of being plated by metals, respectively.

In one embodiment of the present invention, the varied insulation material is a mixed material including a thermoplastic polymer and at least one conductive metal mixed together, so that, after the first varied insulation layer and the second varied insulation layer are projected by the laser beam, the thermoplastic polymer is heated to a thermoplastic temperature so as to have the at least one conductive metal to gather and form the plurality of first metal-disposed portions and the plurality of second metal-disposed portions.

In one embodiment of the present invention, the thermoplastic polymer is formed by at least one of Polycarbonate (PC), Acrylonitrile butadiene styrene (ABS), Polyamide (PA), Polyphthalamide (PPA), Polybutylene terephthalate (PBT), Cyclo olefin polymer (COP), Polyphenylene ether (PPE), Liquid crystal polymer (LCP), Polyetherimide (PEI), Polyetheretherketone (PEEK) and Polyphenylene sulfide (PPS).

In one embodiment of the present invention, the varied insulation material is a catalytic insulation material, so that, after being projected by the laser beam and then undergoing a catalytic process, the first varied insulation layer and the second varied insulation layer form the plurality of first metal-disposed portions and the plurality of second metal-disposed portions, respectively. In addition, the catalytic insulation material is at least one of a photo-catalytic material and a thermal catalytic material.

In one embodiment of the present invention, the first IC chip further includes a lateral connection surface connecting the first disposition surface and the second disposition surface. A lateral varied insulation layer is formed on the lateral connection surface. Also, the laser beam is further projected onto the lateral varied insulation layer so as to form the plurality of connection portions on the first varied insulation layer, the second varied insulation layer and the lateral varied insulation layer. The plurality of connection portions are capable to be plated by metals and connect the plurality of first metal-disposed portions and the plurality of second metal-disposed portions.

As mentioned, the method for manufacturing a memory having a stacked integrated circuit chip provided by the present invention applies a laser beam to form the first metal-disposed portions, the second metal-disposed portions and the connection portions on the first IC chip, so that the chip-conducting structures can connect the first metal-disposed portions, the second metal-disposed portions, the first chip-welding pads and connection portions. In addition, the manufactured weld structures are introduced to connect the first IC chip to the second IC chip, and to mount the first IC chip onto the memory substrate component.

In comparison with the prior art, the method for manufacturing a memory having a stacked integrated circuit chip provided by the present invention is to apply the laser beam to project the first varied insulation layer and the second varied insulation layer so as to form the first metal-disposed portion and the second metal-disposed portion for the chip-conducting structure to be plated thereon. Thereupon, the high-precision and complicated re-distribution layer and flip-chip for package in the art are no more needed in performing the method for manufacturing a memory having a stacked integrated circuit chip provided by the preferred embodiment of the present invention. Thus, additional cost can be avoided in producing the memory.

All these objects are achieved by the method for manufacturing a memory having a stacked integrated circuit chip described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a method for manufacturing a memory having a stacked integrated circuit chip. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
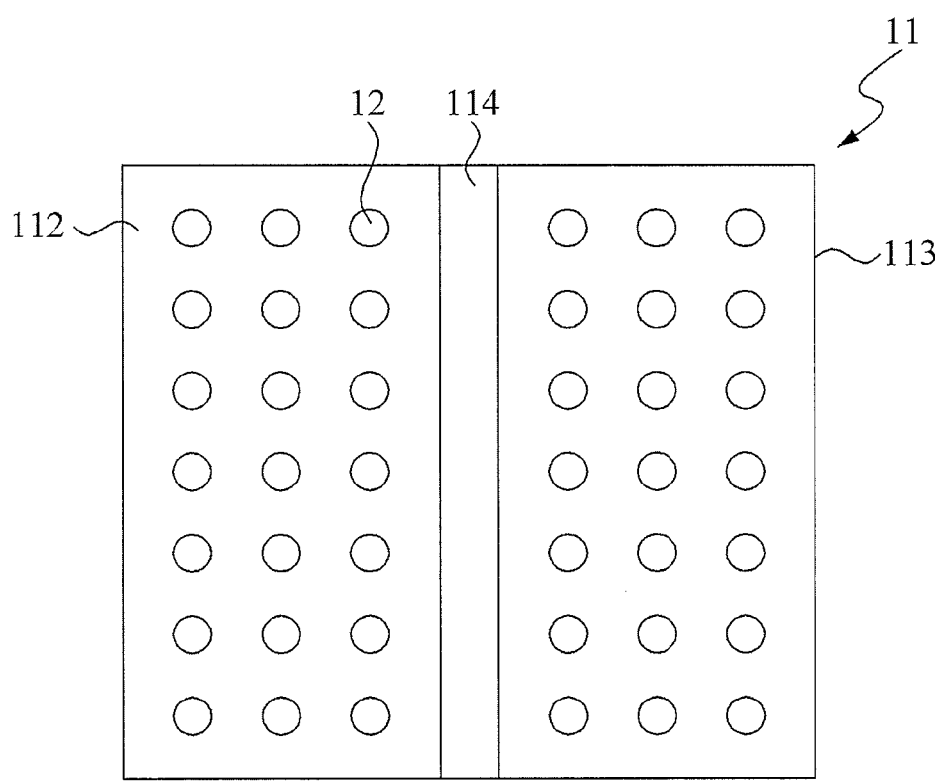
FIG. 1 is a schematic view of a first IC chip having a plurality of transitional weld structures for a first preferred embodiment of the method for manufacturing a memory having a stacked integrated circuit chip in accordance with the present invention.
Figure 2:
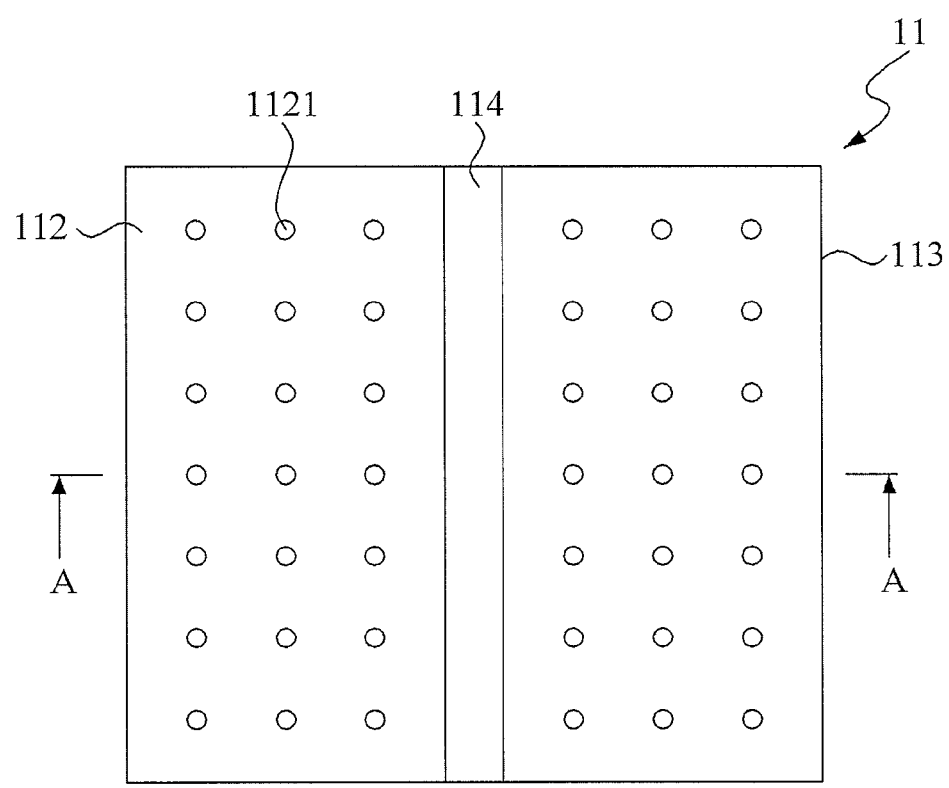
FIG. 2 is a schematic view of the first IC chip of FIG. 1 by removing the transitional weld structures.
Figure 3:
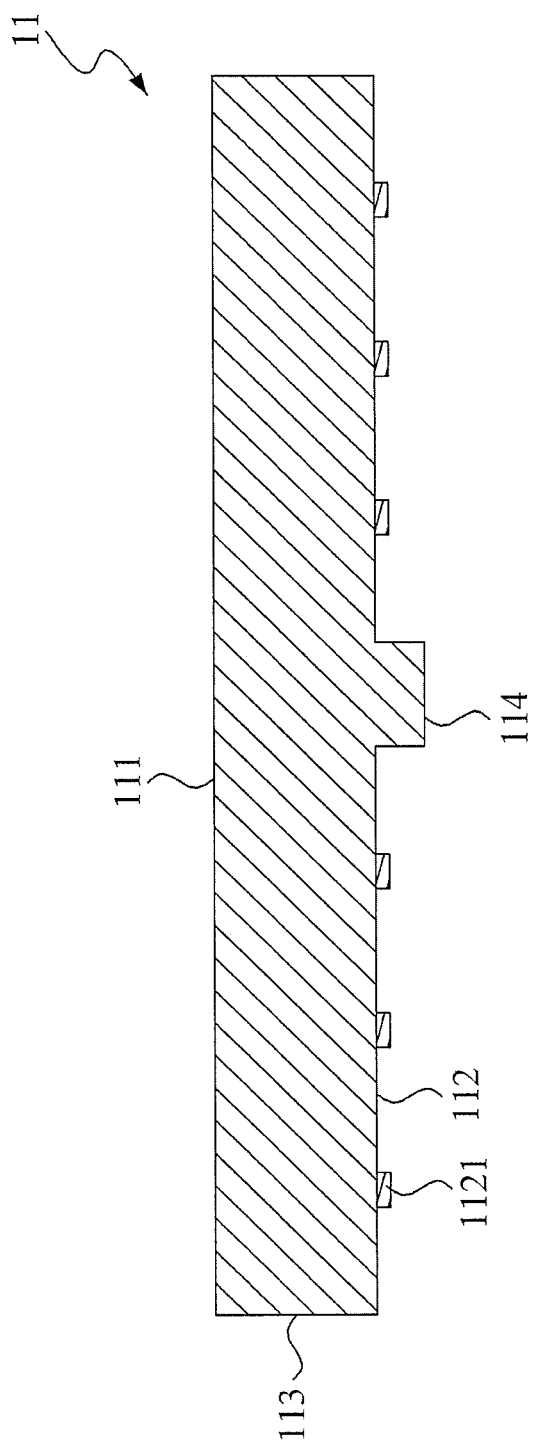
FIG. 3 is a schematically cross-sectional view of FIG. 2 along line A-A.

Refer now to FIG. 1 through FIG. 3; where FIG. 1 is a schematic view of a first IC chip having a plurality of transitional weld structures for a first preferred embodiment of the method for manufacturing a memory having a stacked integrated circuit chip in accordance with the present invention, FIG. 2 is a schematic view of the first IC chip of FIG. 1 by removing the plurality of transitional weld structures, and FIG. 3 is a schematically cross-sectional view of FIG. 2 along line A-A.

As shown, the first preferred embodiment of the present invention provides a manufacturing method of a memory having a stacked IC chip. Firstly, a first IC chip 11 is provided to include a first disposition surface 111, a second disposition surface 112 opposing to the first disposition surface 111 and being furnished with a plurality of transitional weld structures 12, a lateral connection surface 113 connecting the first disposition surface 111 and the second disposition surface 112, and a chip bump 114 located on the second disposition surface 112 as a unique piece. The second disposition surface 112 is further furnished thereon with a plurality of first chip-welding pads 1121, the transitional weld structures 12 disposed on top of the first chip-welding pads 1121 and thereby electrically coupled with the first IC chip 11. Then, the transitional weld structures 12 are removed from the second disposition surface 112.

In this embodiment, the first IC chip 11 can be, but not limited to, an SDP (single die package) chip. In addition, in this embodiment, the transitional weld structures 12 can be, but not limited to, BGA (ball grid array) balls.

Figure 4:
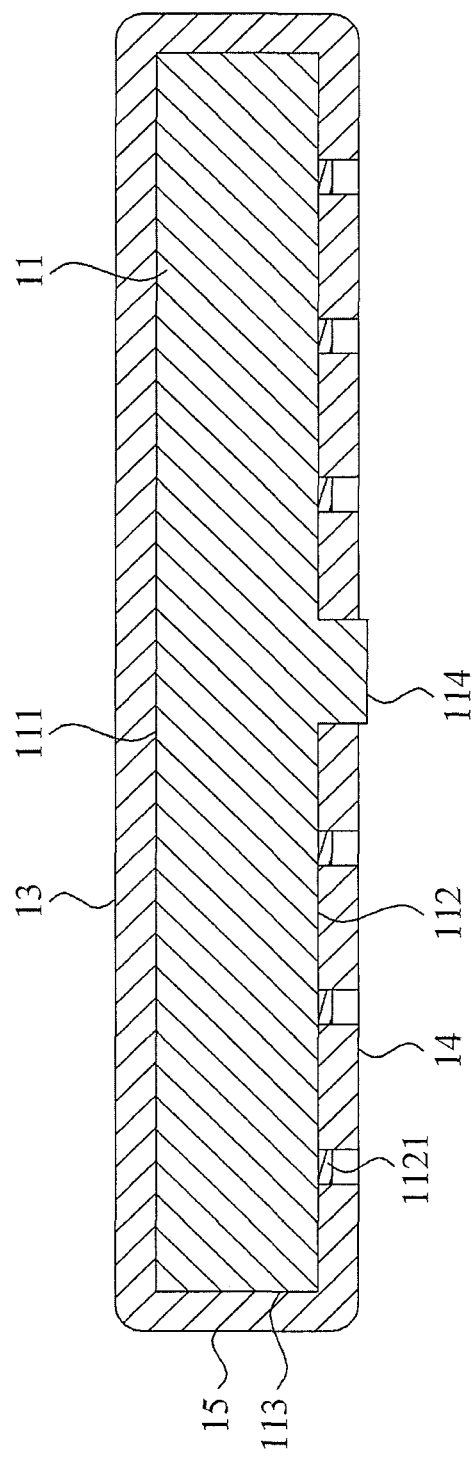
FIG. 4 is a schematic view of an improvement of FIG. 3 where the first IC chip is further plated with a varied insulation material.
Figure 5:
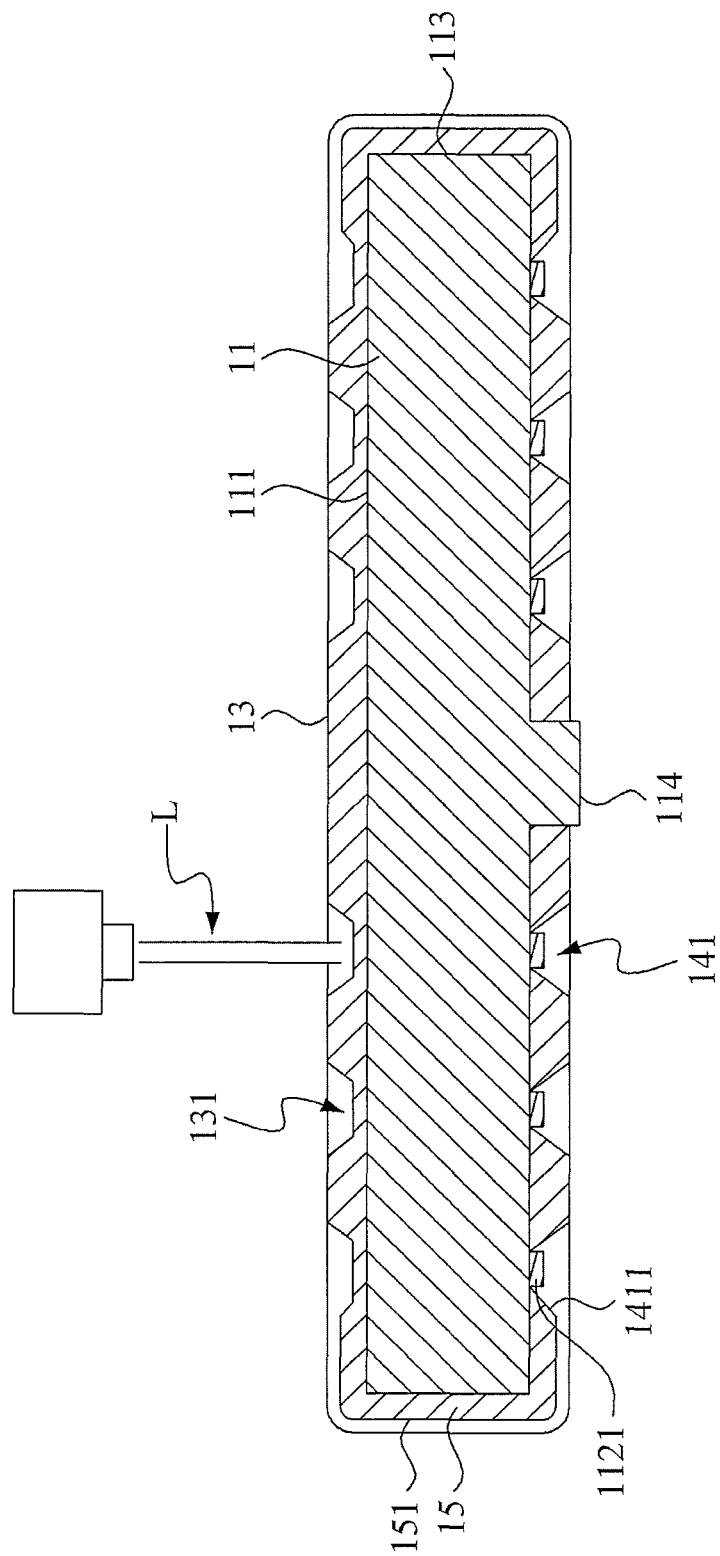
FIG. 5 is a schematic view of an improvement of FIG. 4 where the first IC chip plated with the varied insulation material is further projected by a laser beam.

Refer further to FIG. 4 and FIG. 5; where FIG. 4 is a schematic view of an improvement of FIG. 3 where the first IC chip is further plated with a varied insulation material, and FIG. 5 is a schematic view of an improvement of FIG. 4 where the first IC chip plated with the varied insulation material is further projected by a laser beam.

As shown, a first varied insulation layer 13 is formed on the first disposition surface 111, and a second varied insulation layer 14 is formed on at least a portion of the second disposition surface 112. The first chip-welding pads 1121 are exposed out of the second varied insulation layer 14. In addition, a lateral varied insulation layer 15 is formed on the respective lateral connection surface 113. In the present invention, the first varied insulation layer 13, the second varied insulation layer 14 and the lateral varied insulation layer 15 are all made of a varied insulation material.

In this embodiment, the varied insulation material is a mixed material including a thermoplastic polymer and at least one conductive metal mixed together. Thereupon, while the first varied insulation layer 13, the second varied insulation layer 14 and the lateral varied insulation layer 15 are individually projected by a laser beam L, the thermoplastic polymer would be heated to a thermoplastic temperature so as to have the conductive metal to gather and form a plurality of first metal-disposed portions 131, a plurality of second metal-disposed portion 141 neighboring to respective first chip-welding pads 1121, and a plurality of connection portions 151 capable of being plated by metals, respectively.

Obviously, the varied insulation material is adopted to meet the LDS (laser direct structuring) technique. The thermoplastic polymer is formed by at least one of Polycarbonate (PC), Acrylonitrile butadiene styrene (ABS), Polyamide (PA), Polyphthalamide (PPA), Polybutylene terephthalate (PBT), Cyclo olefin polymer (COP), Polyphenylene ether (PPE), Liquid crystal polymer (LCP), Polyetherimide (PEI), Polyetheretherketone (PEEK) and Polyphenylene sulfide (PPS). Since the aforesaid thermoplastic temperature is varied according to different thermoplastic polymers, and these thermoplastic polymers are all well-known materials to the skill in the art; thus details thereabout are omitted herein.

In other embodiments, the varied insulation material can be a catalytic insulation material, a photo-catalytic material or a thermal catalytic material. Upon when the first varied insulation layer 13, the second varied insulation layer 14 and the lateral varied insulation layer 15 are individually projected by the laser beam L and then undergo respective catalytic processes, then the first metal-disposed portions 131, the second metal-disposed portions 141 and the connection portions 151 would be formed, respectively. In the present invention, the catalytic process can be a photo-catalytic process, a thermal catalytic process, an immersed catalytic process or a wet catalytic process.

Figure 6:
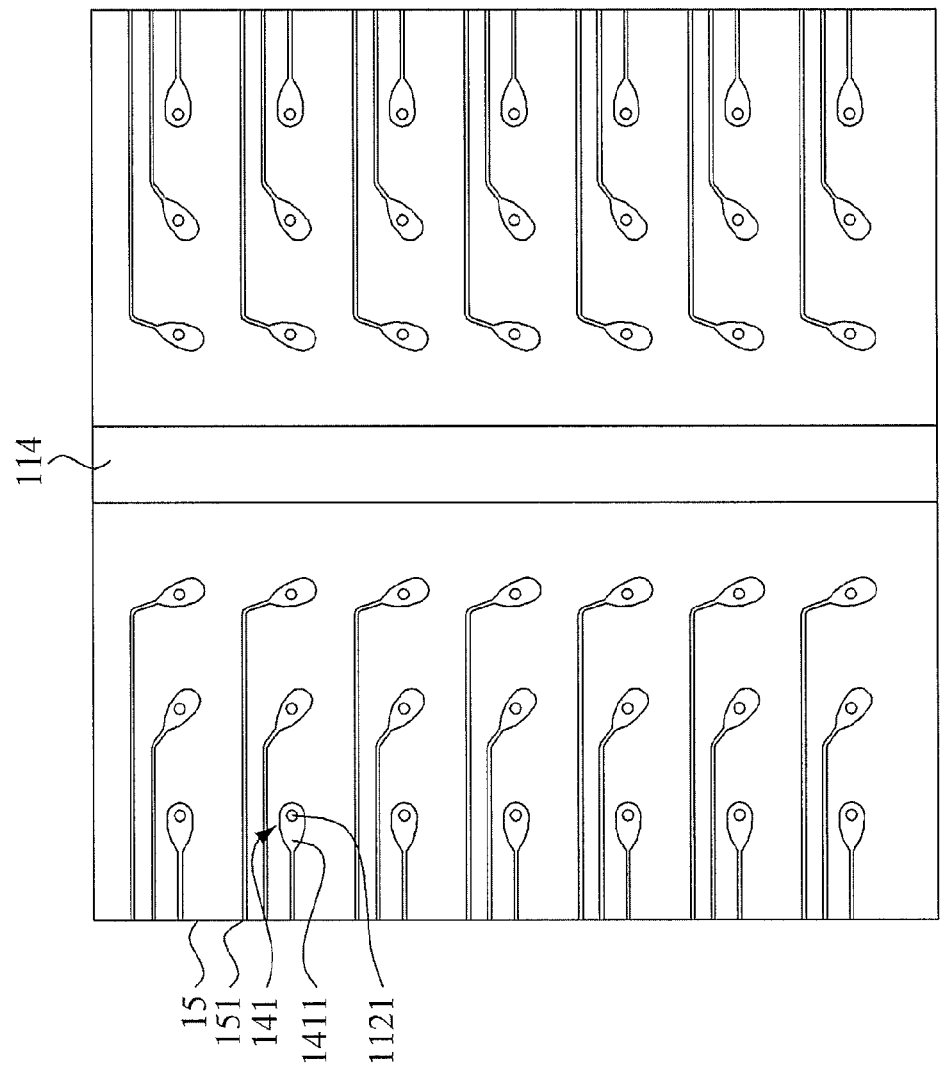
FIG. 6 is a schematic view of the first IC chip, after being plated with the varied insulation material and projected by the laser beam, for the first preferred embodiment of the method for manufacturing a memory having a stacked integrated circuit chip in accordance with the present invention.

Refer further to FIG. 5 and FIG. 6, where FIG. 6 is a schematic view of the first IC chip, after being plated with the varied insulation material and projected by the laser beam, for the first preferred embodiment of the method for manufacturing a memory having a stacked integrated circuit chip in accordance with the present invention.

As shown, the laser beam L is introduced to project onto the first varied insulation layer 13, the second varied insulation layer 14 and the lateral varied insulation layer 15. Thereupon, the first varied insulation layer 13 is projected by the laser beam L to form the first metal-disposed portions 131, and the second varied insulation layer 14 is projected by the laser beam L to form the second metal-disposed portions 141 electrically coupled with the corresponding first chip-welding pad 1121. Also, a plurality of the connection portions 151 for connecting the first metal-disposed portions 131 and the second metal-disposed portion 141 are formed by the first varied insulation layer 13, the second varied insulation layer 14 and the lateral varied insulation layer 15. Namely, the first metal-disposed portions 131, the second metal-disposed portions 141 and the connection portions 151 are formed by performing the LDS technique.

In addition, each of the second metal-disposed portions 141 includes an oblique disposition sidewall 1411 to connect the respective connection portion 151. The second metal-disposed portion 141 of this embodiment is a water drop-shaped disposition portion. However, in some other embodiments, the second metal-disposed portion 141 can be shaped as a weld groove, formed to be a round disposition portion or an elliptic disposition portion. On the other hand, each of the first metal-disposed portions 131 can also be a water drop-shaped disposition portion. However, in some other embodiments, the first metal-disposed portion 131 can be a round disposition portion or an elliptic disposition portion. It is also noted that conjunction areas of the connection portion 151 close to the second disposition surface 112 and the lateral connection surface 113 are respectively formed as, but not limited to, round corners.

Figure 7:
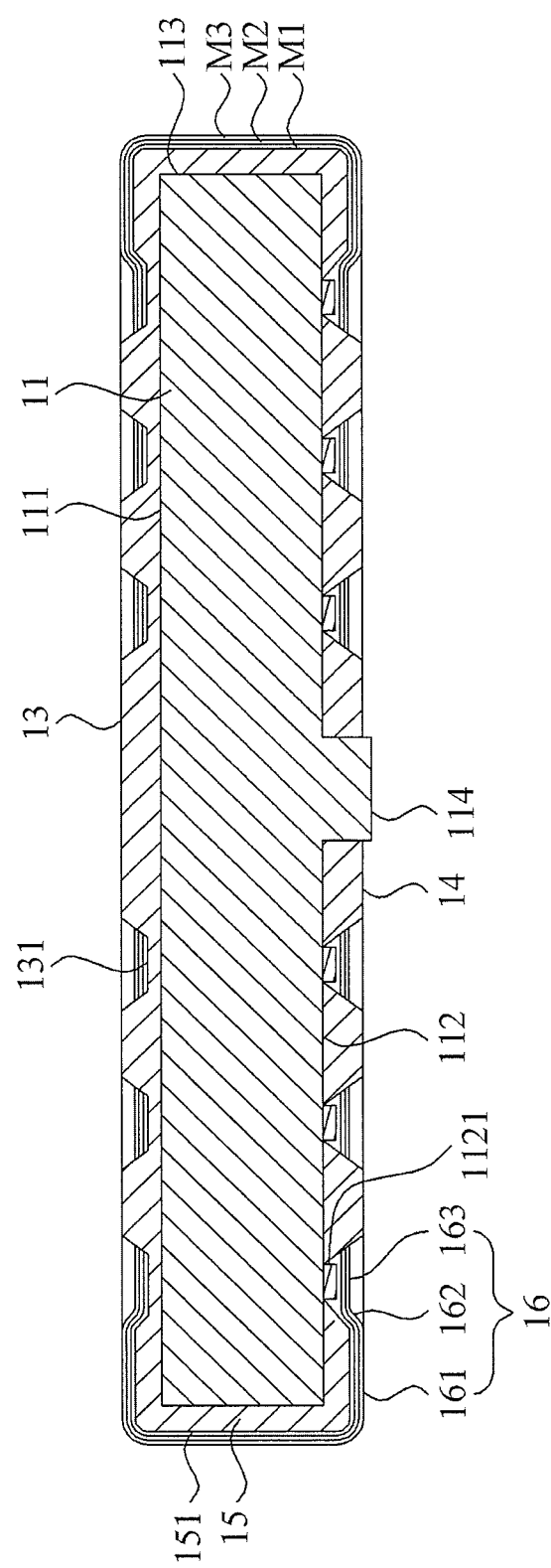
FIG. 7 is a schematic view of an improvement of FIG. 5 where the first IC chip further has chip-conducting structures.

Referring now to FIG. 7, a schematic view of an improvement of FIG. 5 where the first IC chip further has chip-conducting structures is illustrated. As shown, on the first metal-disposed portions 131, the second metal-disposed portions 141, the first chip-welding pads 1121 and the connection portions 151, a plurality of corresponding chip-conducting structures 16 are connectively plated to form by three conductive materials. Each of the chip-conducting structures 16, formed by these three conductive materials, includes a connection lead 161, an oblique contact plate 162 and a welding pad 163.

The connection lead 161 is disposed at the connection portion 151. The oblique contact plate 162, connected with the connection lead 161, is disposed on the oblique disposition sidewall 14111. The welding pad 163, connected with the oblique contact plate 162, is disposed on the first chip-welding pad 1121. Since round corners of the connection portion 151 neighboring to both the second disposition surface 112 and the lateral connection surface 113 do exist, thus possibility of unexpected breaks at the connection lead 161 can be significantly reduced.

In the present invention, the aforesaid three conductive materials include a first conductive material, a second conductive material and a third conductive material. Firstly, the first conductive material is introduced to connectively cover onto the first metal-disposed portion 131, the second metal-disposed portion 141, the first chip-welding pad 1121 and the connection portion 151 so as to form a first conductive layer M1. In this embodiment, the first conductive material is copper (Cu). Then, the second conductive material is introduced to form a second conductive layer M2 covering the first conductive layer M1. In this embodiment, the second conductive material is nickel (Ni). Thereafter, on the second conductive layer M2, the third conductive material is introduced to form a third conductive layer M3. Thereby, the chip-conducting structure 16 is completely formed. In this embodiment, third conductive material is gold (Au).

Figure 8:
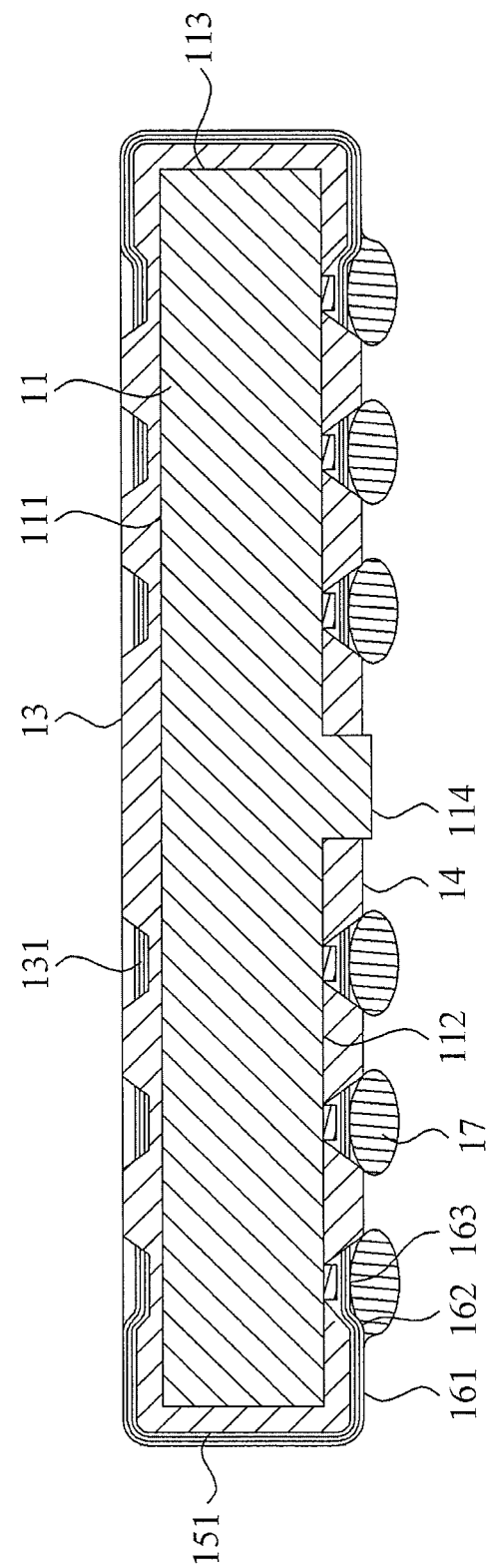
FIG. 8 is a schematic view of an improvement of FIG. 7 where the first IC chip further has manufactured weld structures.

Referring now to FIG. 8, a schematic view of an improvement of FIG. 7 where the first IC chip further has manufactured weld structures is shown. As illustrated, a plurality of manufactured weld structures 17 are both formed on the chip-conducting structure 16 by being close to the second metal-disposed portions 141 and on the first chip-welding pads 1121. Particularly, the manufactured weld structure 17 contacts the corresponding oblique contact plate 162 and the corresponding welding pad 163. In this embodiment, the manufactured weld structure 17 is, but not limited to, a BGA ball. Since the second metal-disposed portion 141 has a water drop shape, thus the contact area between the chip-conducting structure 16 and the manufactured weld structure 17 can be increased, and therefore possible defects such as ill-contacting or parting between the chip-conducting structure 16 and the manufactured weld structure 17 can be avoided.

Figure 9:
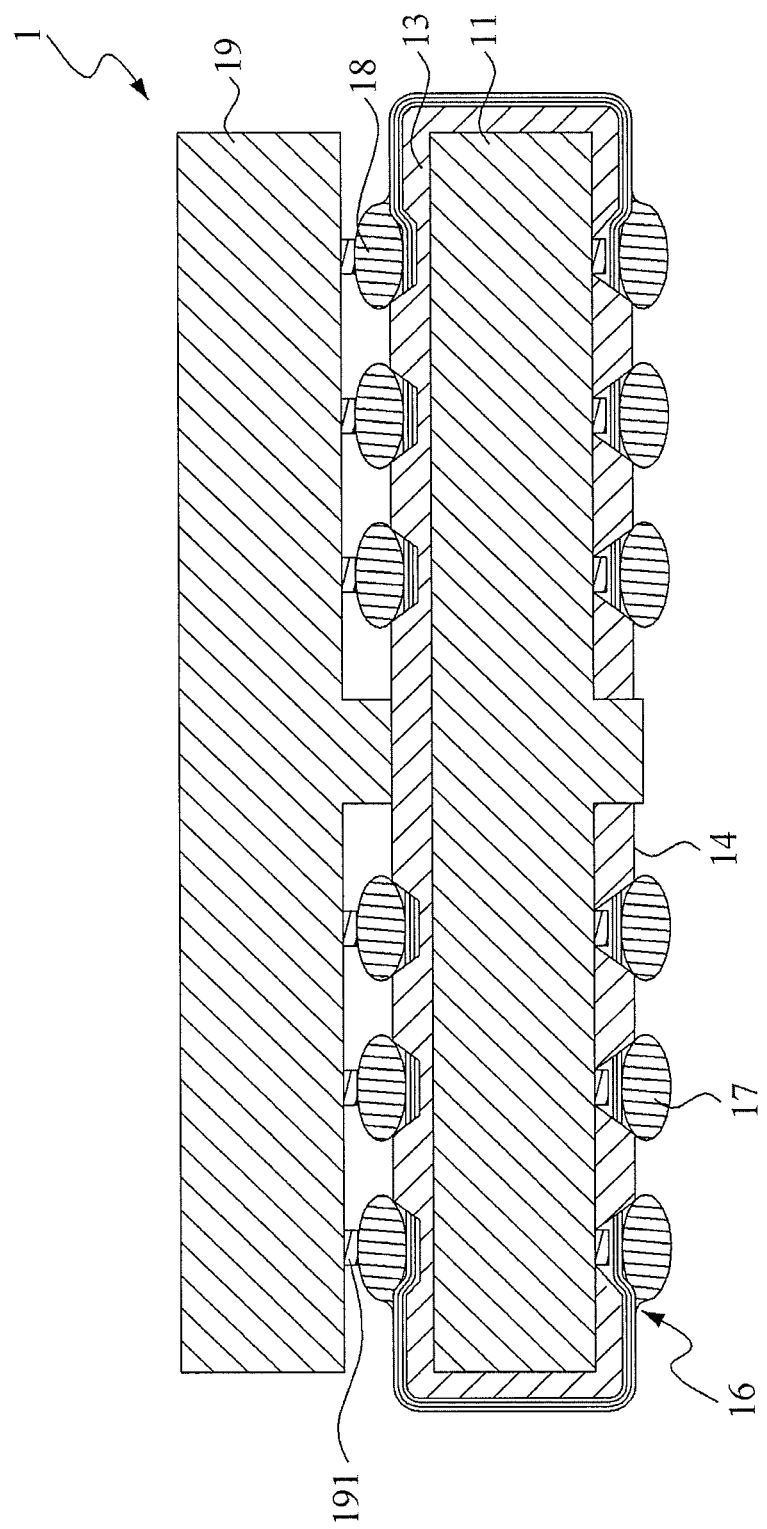
FIG. 9 is a schematic view of an improvement of FIG. 8 where a second IC chip is stacked onto the first IC chip.

Referring now to FIG. 9, a schematic view of an improvement of FIG. 8 where a second IC chip is stacked onto the first IC chip is shown. As illustrated, a second IC chip 19 furnished with a plurality of original weld structures 18 is provided. The original weld structures 18 are arranged to approach the corresponding first metal-disposed portions 131 so as further to connect the respective chip-conducting structures 16, such that a stacked IC chip 1 can be formed.

In the present invention, the second IC chip 19 is furnished with a plurality of second chip-welding pads 191, and the original weld structures 18 are electrically coupled with the corresponding second chip-welding pads 191. In this embodiment, the second IC chip 19 can be, but not limited to, a single-die-package chip. In addition, in this embodiment, the original weld structure 18 can be, but not limited to, a BGA ball.

Figure 10:
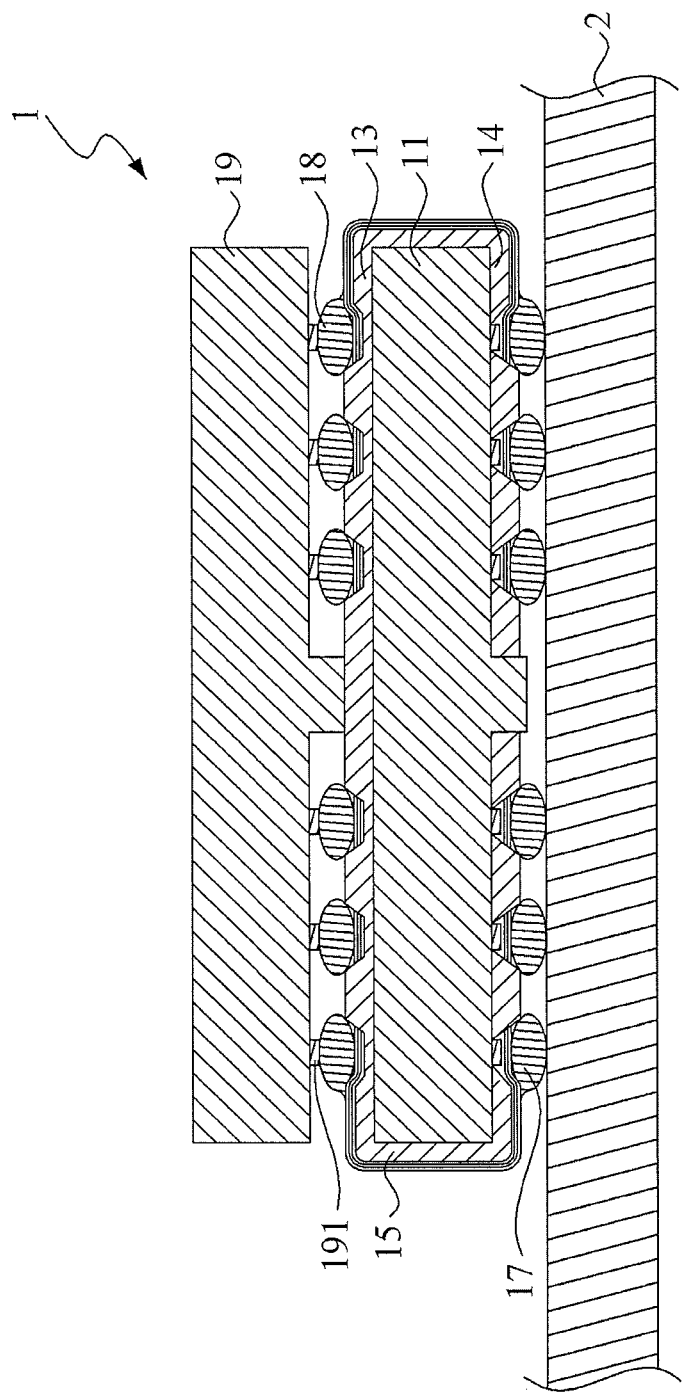
FIG. 10 is a schematic view showing that the stacked IC chip of FIG. 9 is disposed on a substrate.
Figure 11:
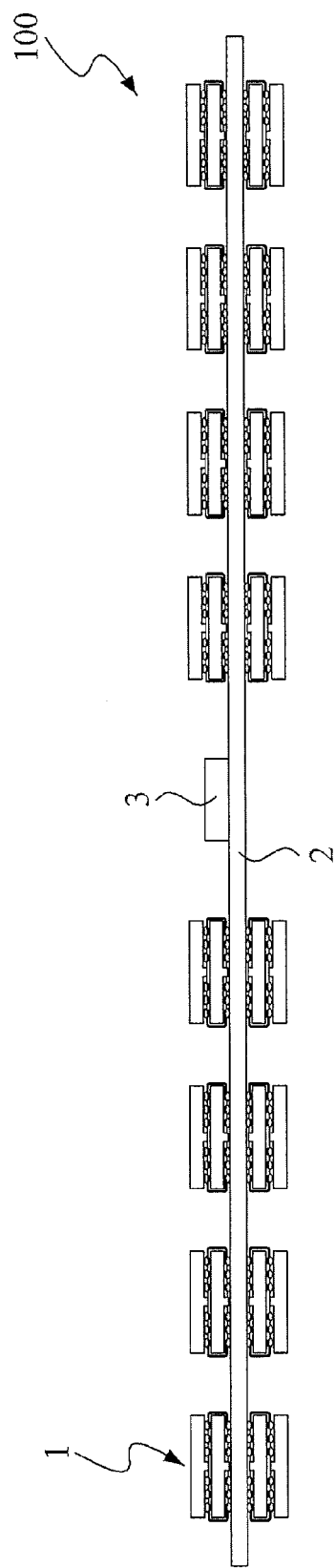
FIG. 11 is a schematic view of a memory having a plurality of stacked IC chips of FIG. 9.

Refer now to FIG. 10 and FIG. 11; where FIG. 10 is a schematic view showing that the stacked IC chip of FIG. 9 is disposed on a substrate, and FIG. 11 is a schematic view of a memory having a plurality of stacked IC chips of FIG. 9. As shown, by repeating the aforesaid steps, a plurality of the stacked IC chips 1 can be formed.

Then, via the manufactured weld structures 17 of each individual stacked IC chip 1, a plurality of the stacked IC chips 1 can be mounted onto a memory substrate component 2 furnished with a memory chip 3, such that a memory having at least one stacked IC chip 100 is formed. In this embodiment, the memory chip 3 can be an advanced memory buffer chip (AMB), and the memory having at least one stacked IC chip 100 can be, but not limited to, a DRAM (Dynamic random access memory).

Figure 12:
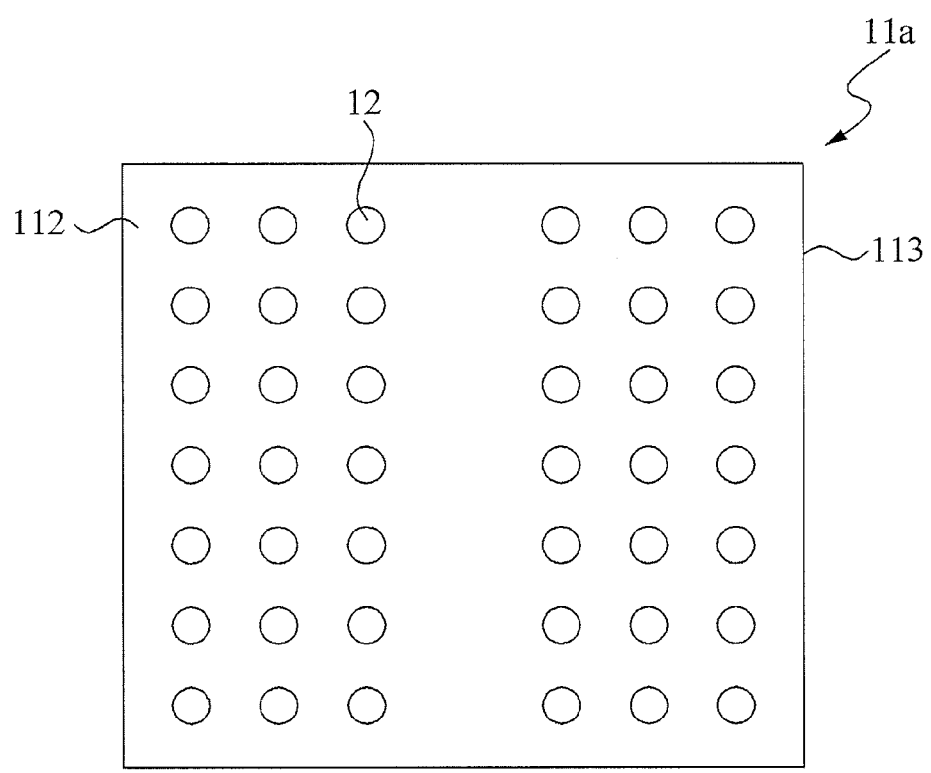
FIG. 12 is a schematic view of a first IC chip having a plurality of transitional weld structures for a second preferred embodiment of the method for manufacturing a memory having a stacked integrated circuit chip in accordance with the present invention.
Figure 13:
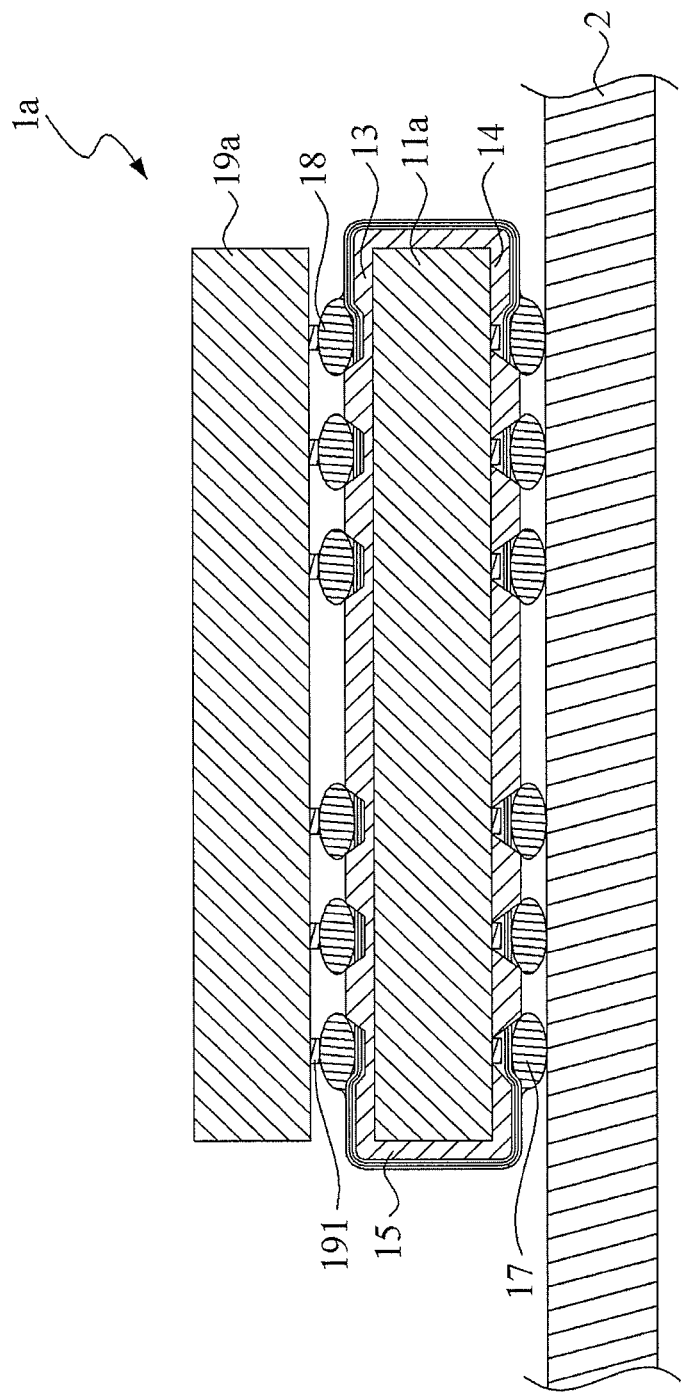
FIG. 13 is a schematic view showing that a stacked IC chip on a substrate for the second embodiment of the method for manufacturing a memory having a stacked integrated circuit chip in accordance with the present invention.

Refer now to FIG. 12 and FIG. 13; where FIG. 12 is a schematic view of a first IC chip having a plurality of transitional weld structures for a second preferred embodiment of the method for manufacturing a memory having a stacked integrated circuit chip in accordance with the present invention, and FIG. 13 is a schematic view showing that a stacked IC chip on a substrate for the second embodiment of the method for manufacturing a memory having a stacked integrated circuit chip in accordance with the present invention.

As shown, the aforesaid second preferred embodiment of the present invention provides a method for manufacturing a memory having at least one stacked IC chip. The method for manufacturing a memory having a stacked IC chip provided by the aforesaid first preferred embodiment and that provided by the instant second preferred embodiment are largely the same. A difference therebetween is that the first IC chip 11a and the second IC chip 19a of the stacked IC chip 1a provided of the second preferred embodiment is arranged integrally to be a DDP chip. Thus, the chip bump 114 of the first preferred embodiment (from FIG. 1 to FIG. 11) does not exist anymore.

In summary, the method for manufacturing a memory having a stacked integrated circuit chip provided by the preferred embodiment of the present invention is firstly to form a first varied insulation layer, a second varied insulation layer and a lateral varied insulation layer from a varied insulation material on the first IC chip. Then, a laser beam is applied to project onto the first varied insulation layer, the second varied insulation layer and the lateral varied insulation layer so as to form first metal-disposed portions, second metal-disposed portions and connection portions, respectively. Then, Cu, Ni and Au are orderly plated onto all the first metal-disposed portions, the second metal-disposed portions, the first chip-welding pads and the connection portions so as to form chip-conducting structures.

Then, manufactured weld structures are welded to the respective chip-conducting structures on the second metal-disposed portion and the first chip-welding pads. Also, on the first metal-disposed portions, the original weld structures are used to connect the second IC chip, so that a stacked IC chip can be finned. Finally, through the manufactured weld structures of the chip-conducting structures of the respective second metal-disposed portions, a plurality of stacked IC chips can be connected with a memory substrate component, so that a memory having at least one stacked IC chip is formed.

In comparison with the prior art, the high-precision dual die package and the complicated re-distribution layer and flip-chip in the art are no more needed in performing the method for manufacturing a memory having a stacked integrated circuit chip provided by the preferred embodiment of the present invention. Thus, by providing the method for manufacturing a memory having a stacked integrated circuit chip in accordance with the present invention, additional cost can be avoided in producing the memory.

While the present invention has been particularly shown and described with reference to a preferred embodiment, it will be understood by those skilled in the art that various changes in form and detail may be without departing from the spirit and scope of the present invention.

What is claimed is:

1. A method for manufacturing a memory having a stacked integrated circuit chip, comprising the steps of:
   (a) providing a first IC chip, the first IC chip including a first disposition surface and a second disposition surface furnished with a plurality of first chip-welding pads, the second disposition surface further having a plurality of transitional weld structures electrically coupled with the plurality of first chip-welding pads;
   (b) removing the plurality of transitional weld structures of the second disposition surface;
   (c) forming a first varied insulation layer and a second varied insulation layer on the first disposition surface and the second disposition surface, respectively; wherein the plurality of first chip-welding pads are exposed out of the second varied insulation layer;
   (d) projecting a laser beam individually onto the first varied insulation layer and the second varied insulation layer so as to form a plurality of first metal-disposed portions from the first varied insulation layer, and further to form a plurality of second metal-disposed portions from the second varied insulation layer by being close to the plurality of first chip-welding pads and electrically coupled with the plurality of first chip-welding pads, both the first metal-disposed portions and the second metal-disposed portions capable of being plated by metals, a plurality of connection portions being connected individually with the plurality of first metal-disposed portions and the plurality of second metal-disposed portions;
   (e) forming a plurality of chip-conducting structures made up by a plurality of conductive materials to connectively cover onto the plurality of first chip-welding pads, the plurality of first metal-disposed portions, the plurality of second metal-disposed portions and the plurality of connection portions;
   (f) forming a plurality of manufactured weld structures both on the plurality of chip-conducting structures on the plurality of second metal-disposed portions and on the plurality of first chip-welding pads;
   (g) providing a second IC chip electrically coupled with a plurality of original weld structures, and connecting the plurality of original weld structures of the second IC chip with the plurality of chip-conducting structures on the plurality of first metal-disposed portions of the first IC chip, so as to form a stacked IC chip; and
   (h) using the plurality of manufactured weld structures to mount the stacked IC chip onto a memory substrate component, so as to form a memory having a stacked IC chip.

2. The method for manufacturing a memory having a stacked integrated circuit chip of claim 1, wherein at least one of the transitional weld structures, the manufactured weld structures and the original weld structures is a BGA (ball grid array) ball.

3. The method for manufacturing a memory having a stacked integrated circuit chip of claim 1, wherein, in the step (d), each of the plurality of second metal-disposed portions includes an oblique disposition sidewall connecting the corresponding connection portion and the corresponding first chip-welding pad; wherein, in the step (e), each of the plurality of chip-conducting structures includes:
   a connection lead, disposed on the corresponding connection portion;
   an oblique contact plate, connecting the connection lead, disposed on the oblique disposition sidewall so as to contact the corresponding manufactured weld structure on the plurality of chip-conducting structures of the plurality of second metal-disposed portions; and
   a welding pad, connecting the oblique contact plate, electrically coupled with the corresponding first chip-welding pad, so as to connect the corresponding manufactured weld structure on the corresponding chip-conducting structure on the corresponding first chip-welding pad and the corresponding second metal-disposed portion.

4. The method for manufacturing a memory having a stacked integrated circuit chip of claim 1, wherein, in the step (e), the plurality of chip-conducting structures are connectively plated onto the plurality of first metal-disposed portions, the plurality of second metal-disposed portions, the plurality of first chip-welding pads and the plurality of connection portions.

5. The method for manufacturing a memory having a stacked integrated circuit chip of claim 1, wherein, in the step (e), the plurality of conductive materials include a first conductive material, a second conductive material and a third conductive material; wherein the step (e) further includes the steps of:
   (e1) forming a first conductive layer by the first conductive material connectively covered onto the plurality of first metal-disposed portions, the plurality of second metal-disposed portions, the plurality of first chip-welding pads and the plurality of connection portions;
   (e2) forming a second conductive layer by the second conductive material on the first conductive layer; and
   (e3) forming a third conductive layer by the third conductive material on the second conductive layer, so as to form the corresponding chip-conducting structure.

6. The method for manufacturing a memory having a stacked integrated circuit chip of claim 5, wherein, in the step (e1), the first conductive material is copper.

7. The method for manufacturing a memory having a stacked integrated circuit chip of claim 5, wherein, in the step (e2), the second conductive material in nickel.

8. The method for manufacturing a memory having a stacked integrated circuit chip of claim 5, wherein, in the step (e3), the third conductive material is gold.

9. The method for manufacturing a memory having a stacked integrated circuit chip of claim 1, wherein, in the step (c), the first varied insulation layer and the second varied insulation layer are formed by a varied insulation material disable to be plated by metals, so that, after being projected by the laser beam, the first varied insulation layer and the second varied insulation layer form the plurality of first metal-disposed portions and the plurality of second metal-disposed portions capable of being plated by metals, respectively.

10. The method for manufacturing a memory having a stacked integrated circuit chip of claim 9, wherein, in the step (c), the varied insulation material is a mixed material including a thermoplastic polymer and at least one conductive metal mixed together, so that, in the step (d), after the first varied insulation layer and the second varied insulation layer are projected by the laser beam, the thermoplastic polymer is heated to a thermoplastic temperature so as to have the at least one conductive metal to gather and form the plurality of first metal-disposed portions and the plurality of second metal-disposed portions.

11. The method for manufacturing a memory having a stacked integrated circuit chip of claim 10, wherein, the thermoplastic polymer is formed by at least one of Polycarbonate (PC), Acrylonitrile butadiene styrene (ABS), Polyamide (PA), Polyphthalamide (PPA), Polybutylene terephthalate (PBT), Cyclo olefin polymer (COP), Polyphenylene ether (PPE), Liquid crystal polymer (LCP), Polyetherimide (PEI), Polyetheretherketone (PEEK) and Polyphenylene sulfide (PPS).

12. The method for manufacturing a memory having a stacked integrated circuit chip of claim 9, wherein, in the step (d), the varied insulation material is a catalytic insulation material, so that, after being projected by the laser beam and then undergoing a catalytic process, the first varied insulation layer and the second varied insulation layer form the plurality of first metal-disposed portions and the plurality of second metal-disposed portions, respectively.

13. The method for manufacturing a memory having a stacked integrated circuit chip of claim 12, wherein the catalytic insulation material is at least one of a photocatalytic material and a thermal catalytic material.

14. The method for manufacturing a memory having a stacked integrated circuit chip of claim 1, wherein, in the step (a), the first IC chip further includes a lateral connection surface connecting the first disposition surface and the second disposition surface; wherein the step (c) further includes a step (c1), and the step (d) further includes a step (d1):

(c1) forming a lateral varied insulation layer on the lateral connection surface; and (d1) projecting the laser beam onto the lateral varied insulation layer so as to form the plurality of connection portions on the first varied insulation layer, the second varied insulation layer and the lateral varied insulation layer, the plurality of connection portions capable of being plated by metals and connecting the plurality of first metal-disposed portions and the plurality of second metal-disposed portions.

\* \* \* \* \*